United States Patent
Chen et al.

[11] Patent Number: 5,841,696
[45] Date of Patent: Nov. 24, 1998

[54] NON-VOLATILE MEMORY ENABLING SIMULTANEOUS READING AND WRITING BY TIME MULTIPLEXING A DECODE PATH

[75] Inventors: Johnny C. Chen, Cupertino; Chung K. Chang, Santa Clara, both of Calif.

[73] Assignee: Advanced Micro Devices, Inc.

[21] Appl. No.: 811,683

[22] Filed: Mar. 5, 1997

[51] Int. Cl.[6] .......................... G11C 16/04; G11C 16/06
[52] U.S. Cl. ........................ 365/185.11; 365/185.23; 365/230.04; 365/230.08
[58] Field of Search ................ 365/189.04, 230.05, 365/230.03, 230.04, 230.06, 230.08, 185.11, 185.23, 185.33

[56] References Cited

U.S. PATENT DOCUMENTS

| | | | |
|---|---|---|---|
| 4,752,871 | 6/1988 | Sparks et al. | 364/200 |
| 5,007,022 | 4/1991 | Leigh | 365/189.04 |
| 5,241,510 | 8/1993 | Kobayashi et al. | 365/230.03 |
| 5,245,572 | 9/1993 | Kosonocky et al. | 365/189.02 |
| 5,276,642 | 1/1994 | Lee | 365/189.04 |
| 5,355,334 | 10/1994 | Koga et al. | 365/189.01 |
| 5,361,343 | 11/1994 | Kosonocky et al. | 395/425 |
| 5,506,810 | 4/1996 | Runas | 365/230.03 |
| 5,684,752 | 11/1997 | Mills | 365/230.03 |
| 5,691,955 | 11/1997 | Yamauchi | 365/233 |

FOREIGN PATENT DOCUMENTS

| | | | |
|---|---|---|---|
| 0 212 451 | 4/1987 | European Pat. Off. | G11C 17/00 |
| 0 372 873 | 6/1990 | European Pat. Off. | |
| 0 376 285 | 7/1990 | European Pat. Off. | |
| 0 745 995 | 4/1996 | European Pat. Off. | G11C 8/00 |

OTHER PUBLICATIONS

Atmel, 4 Megabit 2.7–volt Battery–Voltage™0 Flash with 256 K EEPROM CMOS Combination Memory—AT29BV432 AWAKE™ Memory Architecture.

Atmel, 4 Megabit 5–volt Flash with 256K E$^2$PROM Memory—AT29C432 ConcurrentFlash™.

J., Kruckeberg, "Zweigeteiltes EEPROM: Gleichzeitig auslesen und beschreiben," *Elektronik*, No. 26, 1990, pp. 56–59.

*Primary Examiner*—Son Mai
*Attorney, Agent, or Firm*—Fliesler, Dubb, Meyer & Lovejoy

[57] ABSTRACT

A non-volatile memory that allows simultaneous reading and writing operations by time multiplexing a single x-decode path between read and write operations. This is accomplished using appropriate timing signals to store/latch a first word line for a first operation and then relinquishing the x-decode path so that a second operation can load an address and access a second word line.

40 Claims, 10 Drawing Sheets

NON-VOLATILE MEMORY ENABLING SIMULTANEOUS READING AND WRITING BY TIME MULTIPLEXING A DECODE PATH

BACKGROUND OF THE INVENTION

1. Field of the Invention

The present invention is directed to the field of non-volatile memories. More particularly, this invention relates to a non-volatile memory array with an arrangement that enables simultaneous read and write operations.

2. Description of the Related Art

Electronic systems typically include processors and memory. The memory will be used to store instructions and/or data. In some systems, non-volatile memory is needed to guarantee that the data is continuously stored even when the system is turned off. One non-volatile memory that is widely used is an EPROM. However, conventional EPROMs cannot be reprogrammed in the field. Thus, many electronic designs use EEPROMS, flash memories or battery-backed SRAM, all of which can be reprogrammed electrically. For devices where costs is a factor, flash memories are preferred because they are less expensive than EEPROMs and battery-backed SRAMs.

One problem with prior flash memories is that they do not provide sufficient random access. For example, prior flash memory devices typically do not allow a processor to perform a read operation while a program or erase operation is underway in the flash memory device. Typically, the processor periodically polls a status register of the flash memory device to detect the end of the program or erase operation before initiating a read operation to the flash memory device.

Unfortunately, the programming and erase cycle times for typical flash memory devices are orders of magnitude greater than acceptable read access times of a random access main memory. Such long latencies associated with programming or erase operations can lock up the operating system and prevent the system from functioning for unacceptably long time intervals if the flash memory is the only memory in the electronic system. Some prior flash memories allow erase suspend operations in order to address this problem. However, such memories typically impose a suspend latency interval of several microseconds before a read operation can be initiated.

Prior systems may employ multiple flash memory devices in an attempt to prevent such operating system lock up. In such systems, the processor usually has read access to one of the flash memory devices while other flash memory devices are undergoing a program or erase operation. However, such systems typically suffer from high cost because multiple flash memory devices are implemented even though the capacity of a single flash memory device may accommodate the particular electronic device.

Thus, there is a need for an efficient flash memory device that allows simultaneous read and write operations.

SUMMARY OF THE INVENTION

The present invention provides for a non-volatile memory device that allows for simultaneous read and write operations. The memory device is capable of time multiplexing a single x-decoding path between read and write operations. This is accomplished using appropriate timing signals to store/latch a word line for a first operation and then relinquishing the x-decoding path so that a second operation can use it to load an address and access a word line.

The present invention, roughly described, includes a plurality of non-volatile memory cells, address decode logic, a plurality of access lines and a plurality of electrical latches. The access lines connect the address decode logic to the memory cells. In one embodiment the access lines can include word lines and/or bit lines. The electrical latches are connected to at least a subset of the access lines. The memory can be accessed by decoding a first address, supplying a first access signal, latching the first access signal and accessing a first memory cell using the first access signal. The memory cell accessed corresponds to the address decoded. In one embodiment, supplying an access signal includes driving an appropriate word line and/or bit line in order to perform a read or write operation.

In one alternative, a write address is decoded and the appropriate bit and/or word line(s) are latched. When a read operation is performed, the read address is decoded and the appropriate bit and/or word line(s) are latched. This allows a read operation and a write operation to be performed simultaneously.

These and other objects and advantages of the invention will appear more clearly from the following detailed description in which the preferred embodiment of the invention has been set forth in conjunction with the drawings.

DETAILED DESCRIPTION

Figure 1:
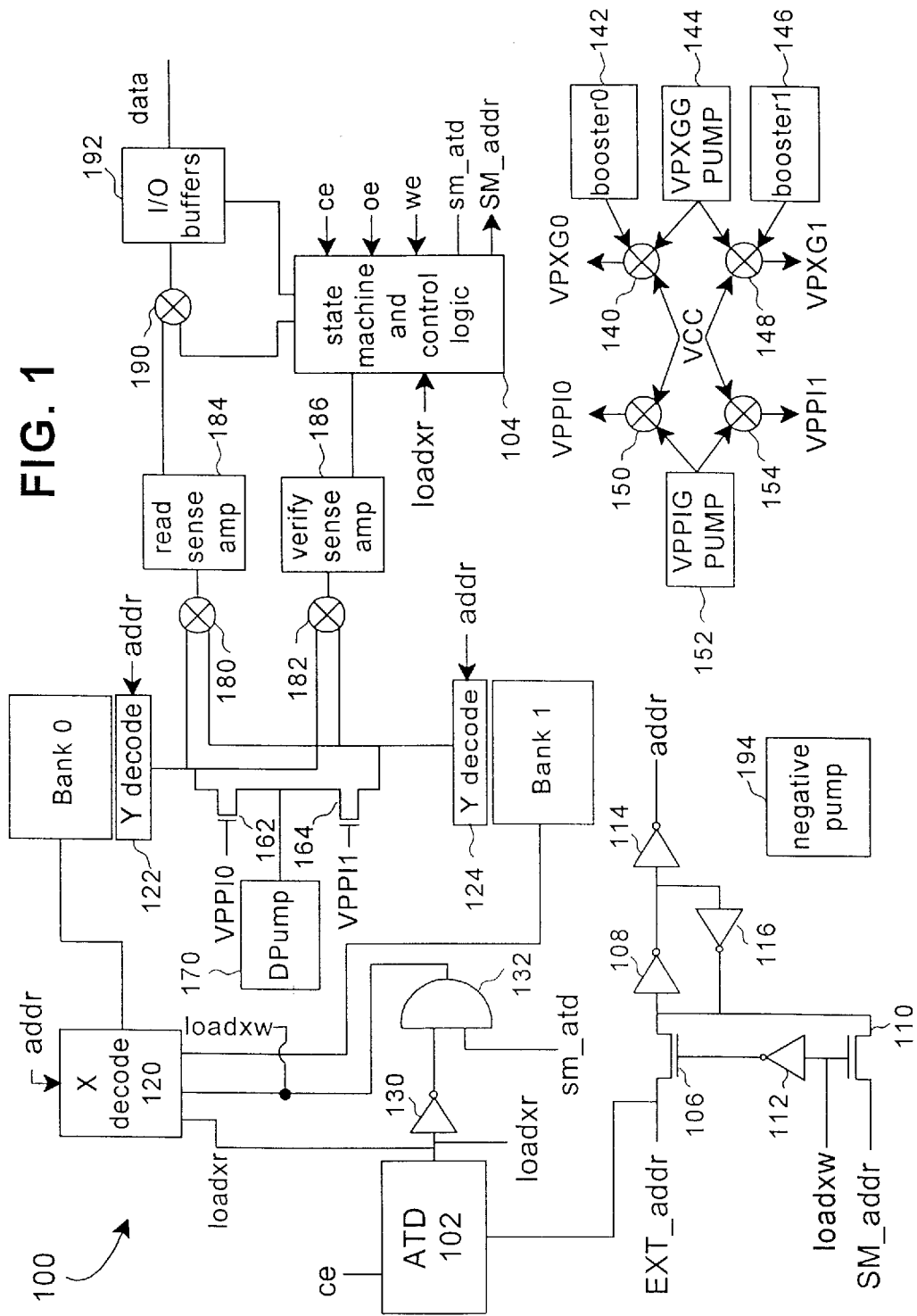
FIG. 1 is a block diagram of a memory device according to the present invention.

FIG. 1 illustrates a non-volatile memory device 100 that enables simultaneous read and write operations. Memory device 100 includes an external address input (EXT_addr), an 8 bit data input/output (data), power inputs (not shown) and control inputs. The control inputs include chip enable (ce), output enable (oe), and write enable (we). The chip enable signal activates the chip's control logic and input buffers. When chip enable is not asserted, the memory device operates in standby mode. Chip enable ce is received by at least the Address Transition Detector 102 and state machine and control logic 104. Output enable is used to gate the outputs of the device through I/O buffers during read cycles. Write enable is used to enable the write functions of the memory device. Output enable oe and write enable we are both received by state machine and control logic 104. In one embodiment, all of the components of FIG. 1 are contained on a single integrated circuit chip.

Address input EXT_addr is sent to transistor 106 and Address Transition Detector 102. Transistor 106 is connected to the input of inverter 108 and transistor 110. The gate of transistor 106 is connected to the output of inverter 112. The output of inverter 108 is connected to the inputs of inverters 114 and 116. The output of inverter 116 is connected to the input of inverter 108. The output of inverter 114 (addr) is connected to X decode 120, Y decode 122, and Y decode 124. Note that the address EXT_addr includes multiple bits; therefore, the circuit includes a set of components for each bit and the output of inverter(s) 114 includes multiple bits which are appropriately routed to the decoders.

Bank 0 and Bank 1 are arrays (or sets) of flash memory cells. Other non-volatile memories are also within the scope of the present invention. Although two banks are depicted in FIG. 1, the present invention will work with more than two banks. For example, many banks can be included, each bank sharing X decode 120 and having its own Y decode logic. Each bank of memory cells includes one or more sectors. Each sector includes a set of memory cells. The present invention can be used with a design that does not organize the cells into banks or sectors.

The address decode logic for Bank 0 includes X decode 120 and Y decode 122. X decode 120 includes word line decode logic and sector decode logic for both banks. The address decode logic for Bank 1 includes X decode 120 and Y decode 124. In one embodiment, the decoders or other circuits can include a latch to store the address being decoded.

Address Transition Detector 102 receives the external address EXT_addr and asserts its output (labeled loadxr) when the external address EXT_addr changes. Thus, loadxr is asserted during a read operation. Loadxr can be asserted even if other internal operations may be taking place. The signal loadxr will be processed during a write operation since a read cycle will be given the highest priority.

The external address EXT_addr is an address generated external to the memory device; for example, a processor accessing the memory device may be generating the external address. The output of Address Transition Detector 102 is connected to inverter 130, state machine and control logic 104 and X decode 120. The output of inverter 130 is connected to a first input of AND gate 132. A second input to AND gate 132 is the signal sm_atd which is generated by state machine and control logic 104. The output of AND gate 132 (labeled loadxw) is communicated to X decode 120, the input of inverter 112 and the gate of transistor 110. By communicated it is meant that the signal is propagated and transmitted to, either directly or indirectly via other circuit elements.

The signal loadxw indicates that a new write address has been generated and, therefore, a write operation is being performed. State machine and control logic 104 includes an address sequencer (or other address generator) in order to generate addresses for write operations. The address generated by state machine and control logic 104 is labeled as SM_addr. When SM_addr changes, the signal sm_atd is asserted by state machine and control logic 104. The address SM_addr is sent to transistor 110.

When a user accesses memory 100 an address is presented at EXT_addr. Address transition detector 102 outputs a logic one on loadxr which forces loadxw to be logic 0, turns off transistor 110 and turns on transistor 106; therefore, selecting EXT_addr for decoding. Thus, the signal addr carries the external address EXT_addr to the decoders.

If there has not been a new address presented at EXT_addr and there is a new address generated by state machine and control logic 104, then sm_atd will be logic one and loadxr will be logic zero. Thus, loadxw will be logic one, transistor 110 will turn on and transistor 106 will be off; thereby, selecting SM_addr for decoding. Thus, the signal addr carries the state machine generated address SM_addr to the decoders.

FIG. 1 shows multiplexer 140 with three inputs: booster0 142, VPXGG pump 144 and VCC. VPXGG pump 144 is a positive power supply for generating and supplying a regulated positive potential to the control gate of selected flash memory cells via word lines. Many different voltage pumps known in the art are suitable for use in the present invention. A more detailed explanation of one technology which can be included in VPXGG pump 144 can be found in U.S. Pat. No. 5,291,446, VPP Power Supply Having A Regulator Circuit For Controlling A Regulated Positive Potential, incorporated herein by reference. Booster0 142 is used to boost the word line during reads. Multiplexer 140 receives a selection signal from state machine and control logic 104 and chooses one of its three inputs to send to the word lines of Bank 0 via X decode 120. The output of multiplexer 140 is labeled as VPXG0. FIG. 1 is drawn to show the three inputs 142, 144 and VCC connected to a multiplexer in order to simplify the disclosure. A more detailed description of one exemplar implementation can be found in U.S. patent application Ser. No. 08/560,459, A Fast 3-State Booster Circuit, filed Nov. 17, 1995, incorporated herein by reference. Many booster circuits and selection circuits known in the art are suitable for use in the present invention.

FIG. 1 also includes multiplexer 148 having three inputs: booster1 146, VPXGG pump 144 and VCC. Booster1 146 is similar to booster0 142. Multiplexer 148 operates similar to multiplexer 140, and receives its selection signal from state machine and control logic 104. The output of multiplexer 148 is VPXG1 which is sent to the word lines of Bank 1. The purpose of multiplexers 140 and 148 is to switch the voltage depending on the operation being performed on the particular bank of memory cells.

VPPIG pump 152 is a high voltage pump used to pass high voltage to the drain of the memory cells. The output of VPPIG pump 152 is sent to multiplexer 150 and multiplexer 154. Both multiplexers also have VCC as an input. Multiplexers 150 and 154 switch between inputs based on signals from state machine and control logic 104. The output of multiplexer 150 is VPPI0 and the output of multiplexer 154 is VPPI1. During normal read operation, VPPI1 and VPPI0 are connected to VCC. VPPI0 is connected to the gate of transistor 162. VPPI1 is connected to the gate of transistor 164. The source of transistor 162 is connected to Y decode 122, multiplexer 180 and multiplexer 182. The drain of transistor 162 is connected to Dpump 170 and the drain of transistor 164. Dpump 170 is a drain power supply. Various drain power supplies known in the art can be used for the present invention. One exemplar drain power supply is disclosed in U.S. Pat. No. 5,263,000, Drain Power Supply, Van Buskirk, et al., incorporated herein by reference. The source of transistor 164 is connected to multiplexer 180, multiplexer 182 and Y decode 124. The connections to multiplexers 180 and 182 provide a path for reading data from Bank 0 and Bank 1. Multiplexer 180 receives a selection control signal from state machine and control logic 104 to selectively choose one of the two input signals to communicate to read sense amplifier 184. Multiplexer 182 receives a selection control signal from state machine and control logic 104 in order to selectively communicate one of its two input signals to verify sense amplifier 186.

Data from either Bank 0 or Bank 1 can be communicated to either read sense amplifier 184 or verify sense amplifier 186. Both sense amplifiers are in communication with state machine and control logic 104. While data from Bank 0 is communicated to read sense amplifier 184, data from Bank 1 can be communicated to verify sense amplifier 186. While data from Bank 0 is communicated to verify sense amplifier 186, data from Bank 1 can be communicated to read sense amplifier 184. The output of verify sense amplifier 186 is sent to state machine and control logic 104, which is used to verify that a particular byte has been programmed or erased. Thus, data can be read from one bank while a write process is being performed on the other bank. In a different embodiment, one sense amplifier can be used for reading and verification, with its input multiplexed between the two banks.

Data from read sense amplifier 184 is sent to multiplexer 190. A second input of multiplexer 190 includes status information from state machine and control logic 104. The selection signal for multiplexer 190 is provided by state machine and control logic 104.

I/O buffers 192 are used to pass data out and receive data into memory device 100. While a read is being performed on one of the banks, multiplexer 190 will communicate output from read sense amplifier 184 to I/O buffers 192. During an erase or program sequence, multiplexer 190 will communicate status information to I/O buffers 192 so that an outside processor can poll memory device 100 for the status in regard to the erase or program being performed.

Memory device 100 also includes negative pump 194, which is used to generate a relatively high negative voltage to control gates of selected memory cells via word lines of either Bank 0 or Bank 1, as selected by state machine and control logic 104. Thus, negative pump 194 is in communication with X decode 120. One example of a negative pump can be found in U.S. patent application Ser. No. 08/559,705, Low Supply Voltage Negative Charge Pump, filed Feb. 15, 1996, incorporated herein by reference.

State machine and control logic 104 provide the control for read, program and erase operations. Many of the selection lines used to select between Bank 0 and Bank 1 are controlled by state machine and control logic 104.

Memory device 100 is programmed using an embedded programming sequence and is erased using an embedded erase sequence. The embedded sequences allow a processor to initiate a program or erase sequence and perform other tasks while the program and erase sequence are being carried out. The embedded program and erase sequences are controlled by state machine and control logic 104, which uses a command register to manage the commencing of either sequence. The erase and programming operations are only accessed via the command register, which controls an internal state machine that manages device operations. Commands are written to the command register via the data input to memory device 100.

In one exemplar embodiment, Bank 0 includes 14 sectors (sector 0–sector 13), each sector having 64K bytes. Bank 1 includes two sectors, sector 14 and sector 15, both of which include 64K bytes. Various embodiments may include other suitable arrangements for Bank 0 and Bank 1, including a different number of sectors, different number of bytes per sector, etc. Additionally, data can be accessed by byte, word or other suitable quantity.

Figure 2:
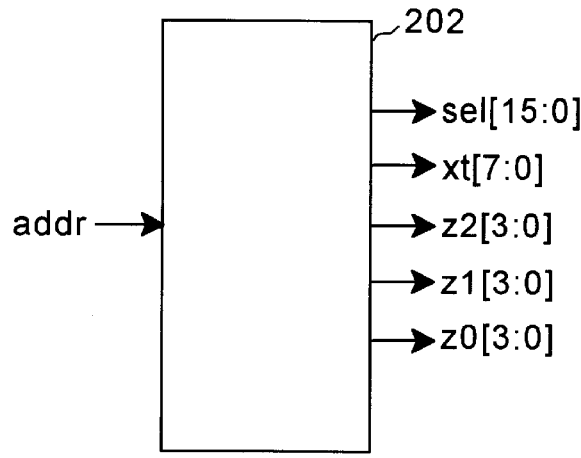
FIG. 2 is a more detailed block diagram of x decoder 120 depicted in FIG. 1.
Figure 2:
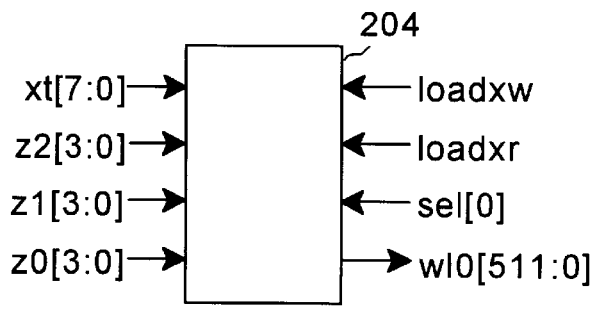
Figure 2:
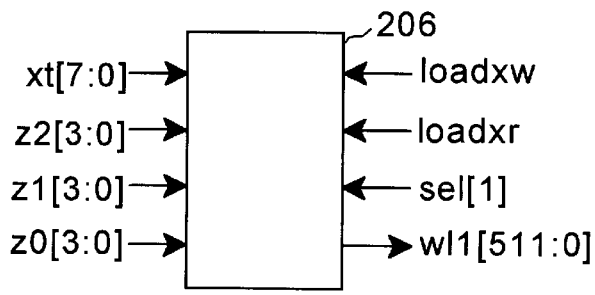
Figure 2:
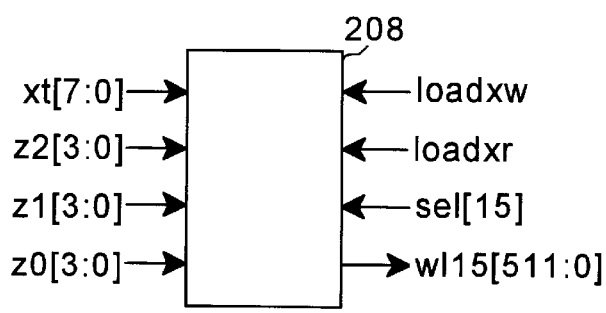

FIG. 2 shows X decode 120 in more detail. A first level of decode logic 202 receives address addr as its input. In this example, X decode 120 can receive thirteen address bits while the Y decodes can receive six address bit. First level of decode logic 202 decodes the address and generates five sets of decode signals: 16 bit sel[15:0], 8 bit xt[7:0], 4 bit z2[3:0], 4 bit z1[3:0] and 4 bit z0[3:0]. The signal sel[15:0] is used to select one of sixteen sectors. For example, if the address is accessing a byte in the first sector then sel[0] is asserted and sel[15:1] are not asserted. The signals xt[7:0], z2[3:0], z1[3:0] and z0[3:0] are used to select a particular word line in the selected sector. For exemplar purposes only, assume that each sector stores 64K bytes and there are 128 bytes per word lines; therefore; there are 512 word lines per sector.

The output of the first level of decode logic 202 is sent to sector level decode logic. There are sixteen sectors, thus, there are sixteen sector level decode logic circuits. Decode logic 204 represents the sector level decode logic circuit for the first sector. Decode logic 206 represents the sector level decode logic circuit for the second sector. Decode logic 208 represents the sector level decode logic circuit for the sixteenth sector. Since the sixteen sector level decode logic circuits are similar and will not fit on one page of drawings, three dots are shown to represent sector level decode logic circuits for the third through fifteenth sectors.

Each of the sector level decode logic circuits are structurally similar; however, each has slightly different inputs and outputs. Each sector level decode logic circuit receives xt[7:0], z2[3:0], z1[3:0], z0[3:0], loadxw and loadxr. Additionally, each sector level decode logic circuit receives the appropriate one of the sector select signals sel[15:0]. Sector level decode logic circuit for the first sector 204 receives sel[0], sector level decode logic circuit for the second sector 206 receives sel[1], ..., sector level decode logic circuit for the sixteenth sector 208 receives sel[15].

Since each sector uses 512 word lines, each sector level decode logic circuit outputs 512 word lines. For example, sector level decode logic circuit 204 for the first sector outputs word lines w10[5 11:0], sector level decode logic circuit 206 for the second sector outputs word lines w11 [511:0], ..., sector level decode logic circuit 208 for the sixteenth sector outputs word lines w115[511:0].

Figure 3:
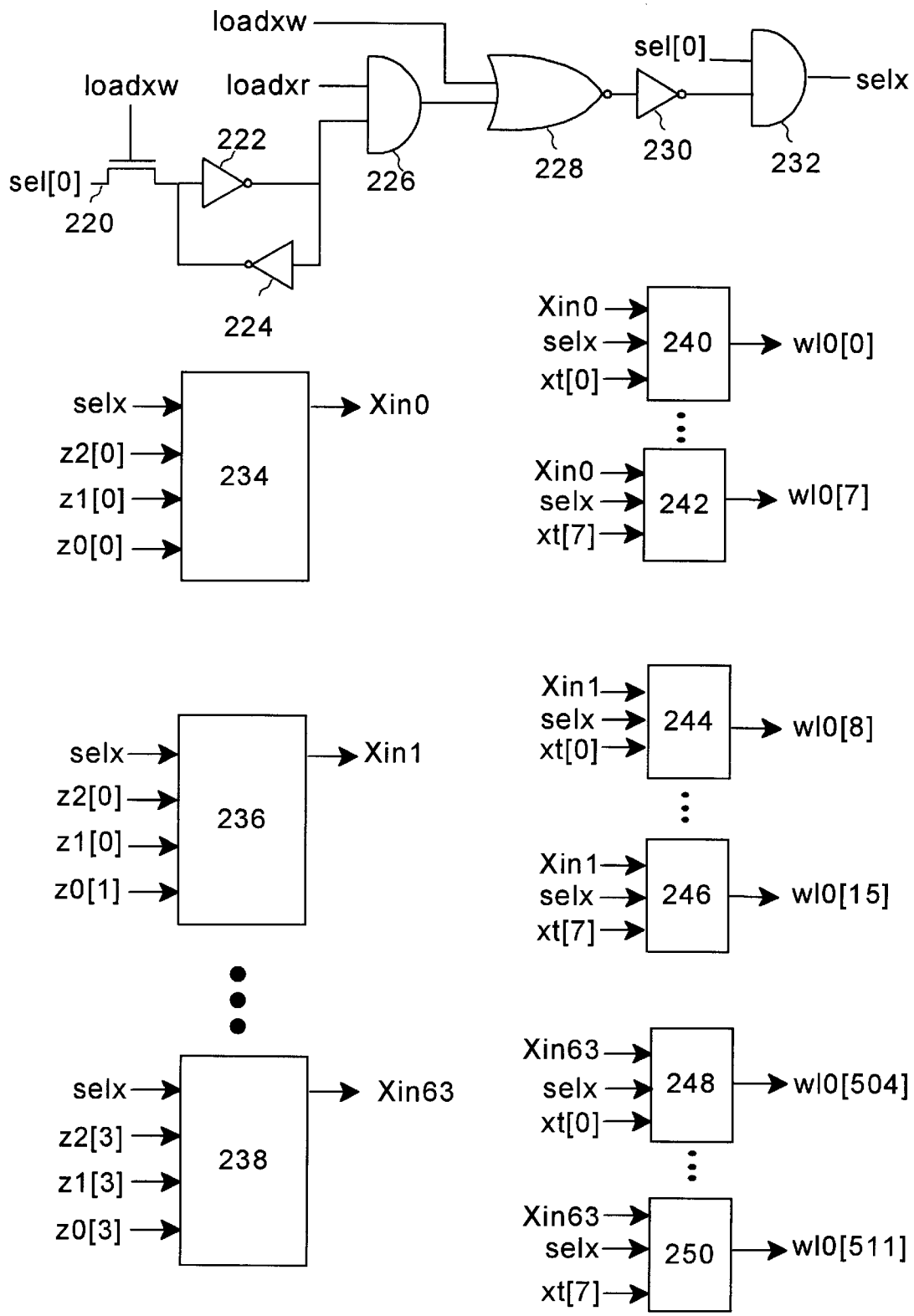
FIG. 3 is a more detailed diagram of the decode logic 202 depicted in FIG. 2.

FIG. 3 illustrates sector level decode logic circuit for the first sector 204 in more detail. Sector select signal sel[0] is connected to transistor 220 and to a first input of AND gate 232. Transistor 220 is also connected to the input of inverter 222 and the output of inverter 224. The output of inverter 222 and the input of inverter 224 are connected to one input of AND gate 226. The signal loadxr is connected to the other input of AND gate 226. The signal loadxw is connected to the gate of transistor 220 and to a first input of NOR gate 228. The output of AND gate 226 is connected to a second input of NOR gate 228. The output of NOR gate 228 is sent to inverter 230. The output of inverter 230 is connected to the second input of AND gate 232. The output of AND gate 232 is labeled as selx. The signal selx is, therefore, asserted when the first sector is selected and either loadxw or loadxr are asserted. Note that if state machine and control logic 104 has selected a sector for a write by previously having asserted loadxw with the appropriate sel line, e.g. sel[0], then the input to AND gate 226 from inverter 222 is low which prevents loadxr from changing the output of AND gate 226. Thus, the same sector cannot be accessed for a read while performing a write.

The sector level decode logic circuit includes sixty four third level decode logic circuits. Each of the third level decode logic circuits receives selx. The third level decode logic circuits also receive one bit of z2[3:0], one bit of z1[3:0], and one bit of z0[3:0]. Table 1 shows which bits of z2[3:0], z1[3:0] and z[3:01 are received by the third level decoder circuits (xin0, xin1, xin2, . . . , xin62, xin63.

TABLE 1

| Circuit | z2[3:0] | z1[3:0] | zo[3:0] |
|---|---|---|---|
| Xin0 (234) | z2[0] | z1[0] | z0[0] |
| Xin1 (236) | z2[0] | z1[0] | z0[1] |
| Xin2 | z2[0] | z1[0] | z0[2] |
| Xin3 | z2[0] | z1[0] | z0[3] |
| Xin4 | z2[0] | z1[1] | z0[0] |
| Xin5 | z2[0] | z1[1] | z0[1] |
| Xin6 | z2[0] | z1[1] | z0[2] |
| Xin7 | z2[0] | z1[1] | z0[3] |
| Xin8 | z2[0] | z1[2] | z0[0] |
| Xin9 | z2[0] | z1[2] | z0[1] |
| Xin10 | z2[0] | z1[2] | z0[2] |
| Xin11 | z2[0] | z1[2] | z0[3] |
| Xin12 | z2[0] | z1[3] | z0[0] |
| Xin13 | z2[0] | z1[3] | z0[1] |
| Xin14 | z2[0] | z1[3] | z0[2] |
| Xin15 | z2[0] | z1[3] | z0[3] |
| Xin16 | z2[1] | z1[0] | z0[0] |
| Xin17 | z2[1] | z1[0] | z0[1] |
| Xin18 | z2[1] | z1[0] | z0[2] |
| Xin19 | z2[1] | z1[0] | z0[3] |
| Xin20 | z2[1] | z1[1] | z0[0] |
| Xin21 | z2[1] | z1[1] | z0[1] |
| Xin22 | z2[1] | z1[1] | z0[2] |
| Xin23 | z2[1] | z1[1] | z0[3] |
| Xin24 | z2[1] | z1[2] | z0[0] |
| Xin25 | z2[1] | z1[2] | z0[1] |
| Xin26 | z2[1] | z1[2] | z0[2] |
| Xin27 | z2[1] | z1[2] | z0[3] |
| Xin28 | z2[1] | z1[3] | z0[0] |
| Xin29 | z2[1] | z1[3] | z0[1] |
| Xin30 | z2[1] | z1[3] | z0[2] |
| Xin31 | z2[1] | z1[3] | z0[3] |
| Xin32 | z2[2] | z1[0] | z0[0] |
| Xin33 | z2[2] | z1[0] | z0[1] |
| Xin34 | z2[2] | z1[0] | z0[2] |
| Xin35 | z2[2] | z1[0] | z0[3] |
| Xin36 | z2[2] | z1[1] | z0[0] |
| Xin37 | z2[2] | z1[1] | z0[1] |
| Xin38 | z2[2] | z1[1] | z0[2] |
| Xin39 | z2[2] | z1[1] | z0[3] |
| Xin40 | z2[2] | z1[2] | z0[0] |
| Xin41 | z2[2] | z1[2] | z0[1] |
| Xin42 | z2[2] | z1[2] | z0[2] |
| Xin43 | z2[2] | z1[2] | z0[3] |
| Xin44 | z2[2] | z1[3] | z0[0] |
| Xin45 | z2[2] | z1[3] | z0[1] |
| Xin46 | z2[2] | z1[3] | z6[2] |
| Xin47 | z2[2] | z1[3] | z0[3] |
| Xin48 | z2[3] | z1[0] | z0[0] |
| Xin49 | z2[3] | z1[0] | z0[1] |
| Xin50 | z2[3] | z1[0] | z0[2] |
| Xin51 | z2[3] | z1[0] | z0[3] |
| Xin52 | z2[3] | z1[1] | z0[0] |
| Xin53 | z2[3] | z1[1] | z0[1] |
| Xin54 | z2[3] | z1[1] | z0[2] |
| Xin55 | z2[3] | z1[1] | z0[3] |
| Xin56 | z2[3] | z1[2] | z0[0] |
| Xin57 | z2[3] | z1[2] | z0[1] |
| Xin58 | z2[3] | z1[2] | z0[2] |
| Xin59 | z2[3] | z1[2] | z0[3] |
| Xin60 | z2[3] | z1[3] | z0[0] |
| Xin61 | z2[3] | z1[3] | z0[1] |
| Xin62 | z2[3] | z1[3] | z0[2] |
| Xin63 (238) | z2[3] | z1[3] | z0[3] |

Each of the third level decode logic circuits has an output labeled Xin#, where the first of the third level decode logic circuits (234) has an output labeled Xin0, the second of the third level decode logic circuits (236) has an output labeled Xin1, . . . , the sixty fourth of the third level decode logic circuits (238) has an output labeled Xin63. The signals z2, z1 and z0 are used to select one of the third level decode logic circuits. Each of the third level decode logic circuits are associated with eight word lines; therefore, z2, z1 and z0 are used to select a group of eight word lines.

For each word line there is a word line selection circuit. Since each of the third level decode logic circuits are associated with eight word lines, the output (Xin#) of a third level decode logic circuit is connected to eight word line selection circuits. FIG. 3 shows third level decode logic circuit 234 connected to eight word line selection circuits labeled as 240 . . . 242. Third level decode logic circuit 236 connected to eight word line selection circuits labeled as 244 . . . 246. Third level decode logic circuit 238 connected to eight word line selection circuits labeled as 248 ... 250. Each word line selection circuit is structurally the same but has different inputs and is connected to a different word line. The eight word line selection circuits connected to third level decode logic circuit 234 via Xin0 all receive selx, but are differentiated by the signal xt[7:0]: the first word line selection circuit 240 receiving xt[0] and being connected to word line w10[0], the second word line selection circuit receiving xt[1] and being connected to word line w10[1], . . . , the eighth word line selection circuit 242 receiving xt[7] and being connected to word line w10[7]. The label for each word line uses the following format w1#[%], where # indicates the sector and % indicates the word line number for that sector. The signals z2, z1 and z0 select the third level decode logic circuit and, therefore, narrow down the selection to eight word lines. The signal xt is used to select the specific one word line from the set of eight.

Figure 4:
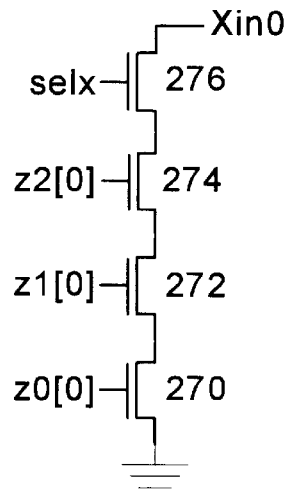
FIG. 4 is a schematic of the decode logic circuit 234 depicted in FIG. 3.

FIG. 4 is a schematic of third level decode logic circuit 234. The signal z0[0] is connected to the gate of transistor 270. The signal z1[0] is connected to the gate of transistor 272. The signal z2[0] is connected to the gate of transistor 274. The signal selx is connected to the gate of transistor 276. Transistor 270 is connected between ground and transistor 272. Transistor 274 is connected between transistor 276 and transistor 272. The drain of transistor 276 is labeled as Xin0.

Figure 5:
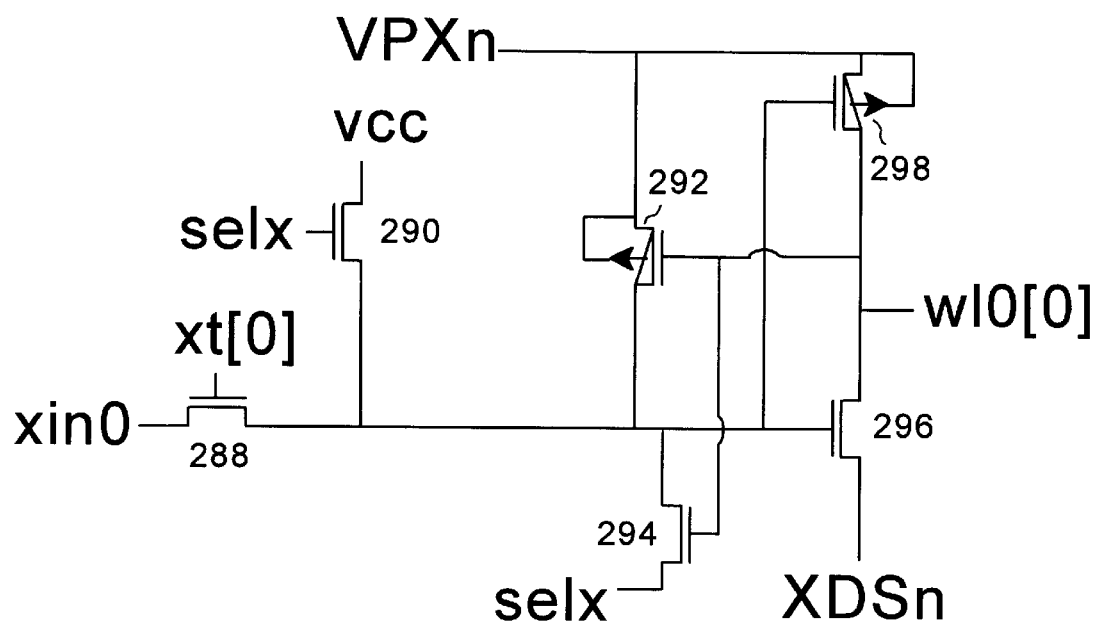
FIG. 5 is a schematic of the word line selection circuit 240 depicted in FIG. 3.

FIG. 5 is a schematic word line selection circuit 240. The signal xin0 is connected to transistor 288. The gate of transistor 288 is connected to xt[0]. Transistor 288 is also connected to transistor 290, transistor 292, transistor 294, the gate of transistor 296 and the gate of transistor 298. Transistor 290 is also connected to VCC and its gate is connected to selx. Transistor 298 is connected between word line w10[0] and VPXn. Transistor 296 is connected between XDSn and word line w10[0]. The gates of transistors 294 and 292 are connected to word line w10[0]. Transistor 294 is also connected to selx and transistor 292 is connected to VPXn. The signal VPXn is a switchable positive power supply to the word line. In one embodiment, VPXn is nine volts for programming, vcc during other periods and zero volts for erase. The signal XDSn is a switchable negative power supply to the word line that is negative nine volts during erase.

Note that the pull down path using transistors 288, 270, 272, 274 and 276 must be stronger than transistor 290 in order for the node at the gate of transistor 296 to be low. This implies that transistor 290 must be fairly weak and that is why transistor 294 has its source tied to SELX so that the node connected to the gate of transistor 296 can be pulled high without any other transistors trying to fight against it when this word line is non-selected, e.g. the path through transistors 270, 272, 274, 276 and 288 is off.

Transistor 292, 294, 296 and 298 act like an electrical latch, which is defined as an electrical device that holds its output at an appropriate voltage level, even when the input is disconnected. In this case transistors 292, 294, 296 and 298 hold the word line at the appropriate voltage (e.g. a voltage for a read operation, erase operation or program operation). During operation when a user of the memory device desires to read data, a new address is presented at EXT_addr. Address transition detector 102 senses the new address and causes the external address to be forwarded to the decoders via the signal ADDR. When the address transition detector 102 determines that there is a new address, loadxr is asserted. X decoder 120 decodes the address to select the appropriate word line. The selected word line is driven and latched to the appropriate voltage level. New word lines are selected and deselected only during the duration of loadxr or loadxw. They are latched, meaning the address information is held (or stored) until the next occurrence of loadxr or loadxw.

In the embodiment disclosed in FIG. 1, the write process, which includes programming and erase, is performed as an embedded write process under the control of state machine and control logic 104. When state machine and control logic 104 generate a new address, loadxw signal is asserted, the address is decoded and the appropriate word line is latched. Since the selected word line information is latched, the system is basically time multiplexing the X decoding path so that it can be used by the read sequence and the write sequence virtually simultaneously. In one embodiment, the read sequence has priority over the write sequence so loadxr can interrupt loadxw. If this happens, state machine and control logic 104 senses the loadxr and restarts loadxw after loadxr has finished. Loadxr is generally only active for half of the read access time in order to ensure that there will be time for loadxw to occur before the next loadxr is generated.

The Y decoders are similar to technology known in the art. Each one determines whether the addressed cell is within the bank associated with that Y decoder. If so, the Y decoder determines the appropriate bit line. The x decoder of the present invention can be used with various y decode schemes. For example, it is within this present invention to utilize the same technology in the X decoder and the Y decoder. That is, use only one Y decoder and latch the appropriate bit line. In the embodiment of FIG. 1, which includes two banks each having its own y decoder, while one bank is being used for a write the other bank can be used for a read. If the technology of the x decoder is suitably used in the y decoder so that there is only one y decoder, then a read and write can be performed on the same bank of memory cells.

Figure 6:
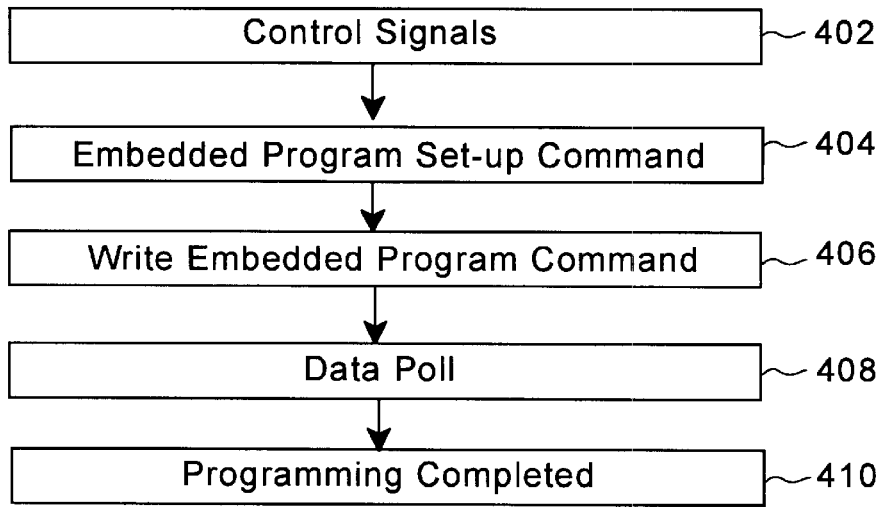
FIG. 6 is a flow chart describing how to program the memory device of FIG. 1.

FIG. 6 illustrates the steps performed by a user of memory device 100 to program a byte in either Bank 0 or Bank 1. First, the user must assert any necessary control signal (step 402). That is, the user must use control inputs to put the memory device 100 into program mode. By the term user, it is meant a processor or other component seeking access to memory. The user then inputs the embedded program set-up command (step 404) followed by the user inputting the embedded program command (step 406). Alternative embodiments include combining steps 402, 404 and 406 into one command. The embedded program set-up command stages the device for automatic programming of the addressed bytes. After step 406, state machine and control logic 122 perform the embedded program sequence. While the embedded program sequence is being performed, the user can poll memory device 100 for status (step 408). After the embedded program sequence is over, the program operation is complete (step 410).

Figure 7:
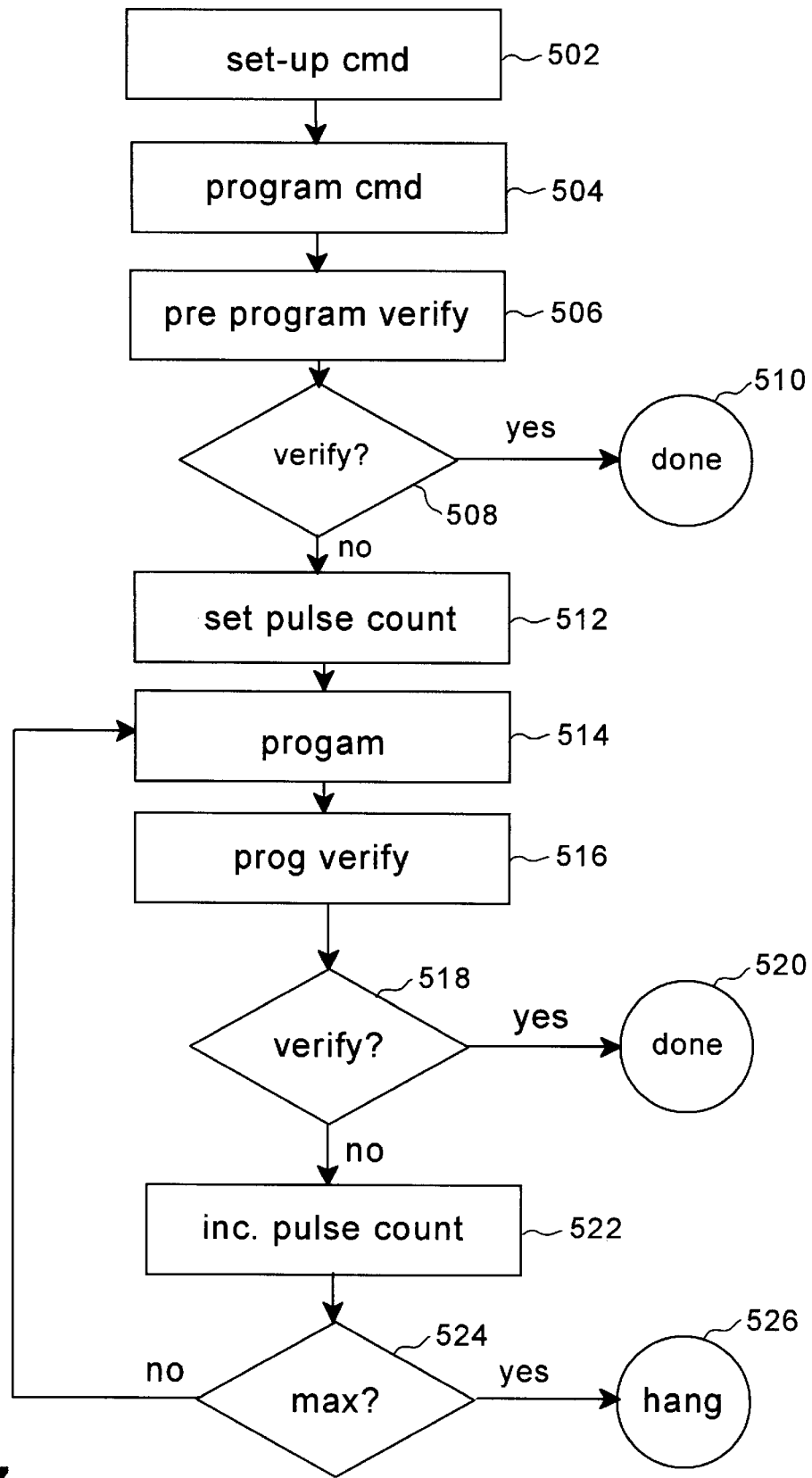
FIG. 7 is a flow chart which explains how the state machine in FIG. 1 performs the programming sequence.

FIG. 7 is a flow chart of the embedded program sequence controlled by state machine and control logic 104. When the user writes the set-up command in step 404, the state machine receives the set-up commands in step 502. When the user writes the program command in step 406, the state machine receives the program command in step 504. At that point, the user writes the address of the byte to be programmed on the address input 102. Subsequently, memory device 100, under the control of state machine and control logic 104, performs a preprogram verify in step 506. That is, prior to programming a byte, the device determines whether the bits in the byte are already programmed. If the necessary bits have already been programmed (step 508), then there is no need to perform the rest of the programming steps and the programming is complete (step 510).

If all of the necessary bit have not already been programmed, then the pulse counter is initialized in step 512. In step 514, a programming pulse is applied to the necessary bits and those bits are programmed. In step 516 the programmed byte is verified. That is, it is determined whether the programming was successful. In step 516, the device reads the byte from the respective bank and sends it to sense amplifier 186. In step 518, state machine and control logic 104 determines whether the program was successful. If the program was successful, then the program sequence is completed (step 520). If the programming was not successful, the pulse counter is incremented (step 522). The pulse counter is internal to the state machine logic. After the pulse counter is incremented, it is determined whether the pulse counter is at the maximum allowed value (step 524). One exemplar maximum allowed value is 250 pulses. If the maximum value has been reached, then the program sequence has failed and the memory device 100 hangs (step 526). If the pulse counter has not reached the maximum value, then the programming step (step 514) is performed again with the additional pulse. The flow continues to steps 516 and 518 as described above.

During the program operation, the state machine uses the address to determine which sector the programmed byte is within. By knowing which sector the byte is in, the state machine knows which bank the byte is in. During the verify steps, state machine and control logic 104 causes multiplexer 182 to select the output from the proper bank in order to send the data to verify sense amplifier 186. State machine and control logic 104 also sends the correct control signals to multiplexers 140, 148, 150 and 154. If the byte being programmed is in Bank 0, the user is unable to read Bank 0. A user can continually data poll (step 408) until the programming sequence is complete. At that point a user can then read from Bank 0. However, while the program sequence is being performed for Bank 0, a user can read from Bank 1. Similarly, while a byte is being programmed in Bank 1, a user can read from Bank 0.

Figure 8:
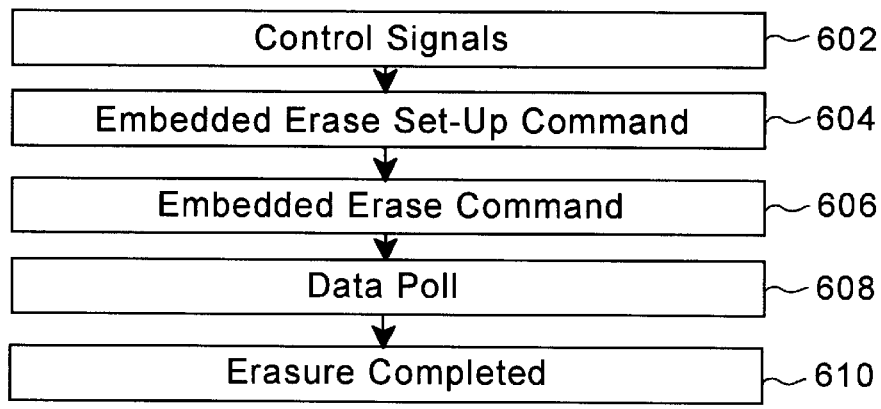
FIG. 8 is a flow chart which explains how to erase the memory device of FIG. 1.

FIG. 8 illustrates the steps performed by a user to erase a sector of memory device 100. The first step 602 is to apply the proper control inputs. A user must then send the embedded erase set-up command (step 604) followed by the embedded erase command (step 606). In one alternative, step 602, 604 and 606 can be combined into one step. After step 606, the embedded erase sequence commences, under control of state machine and control logic 122. While the embedded erase sequence is proceeding, a user can poll for status (step 608). In one embodiment, one of the data bits will be designated as a status bit. This status bit will be logic 0 until the erase operation is completed. Upon completion of the erase operation, the data on that status bit will be logic 1 for a defined period of time. After the embedded erase sequence is finished, erasure is completed (step 610).

Figure 9A:
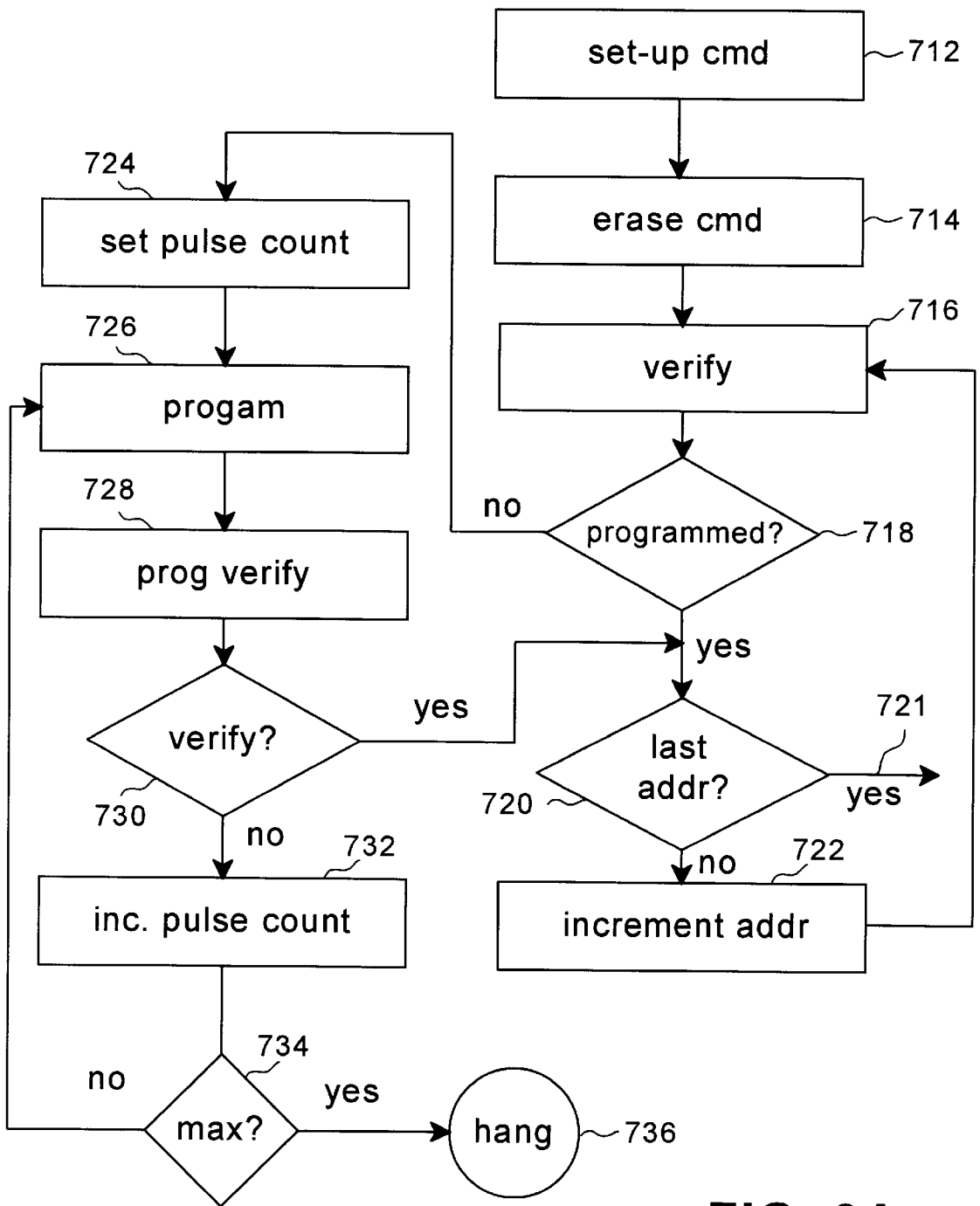
FIGS. 9A and 9B are flow charts which explain how the state machine in FIG. 1 performs the erase sequence.
Figure 9B:
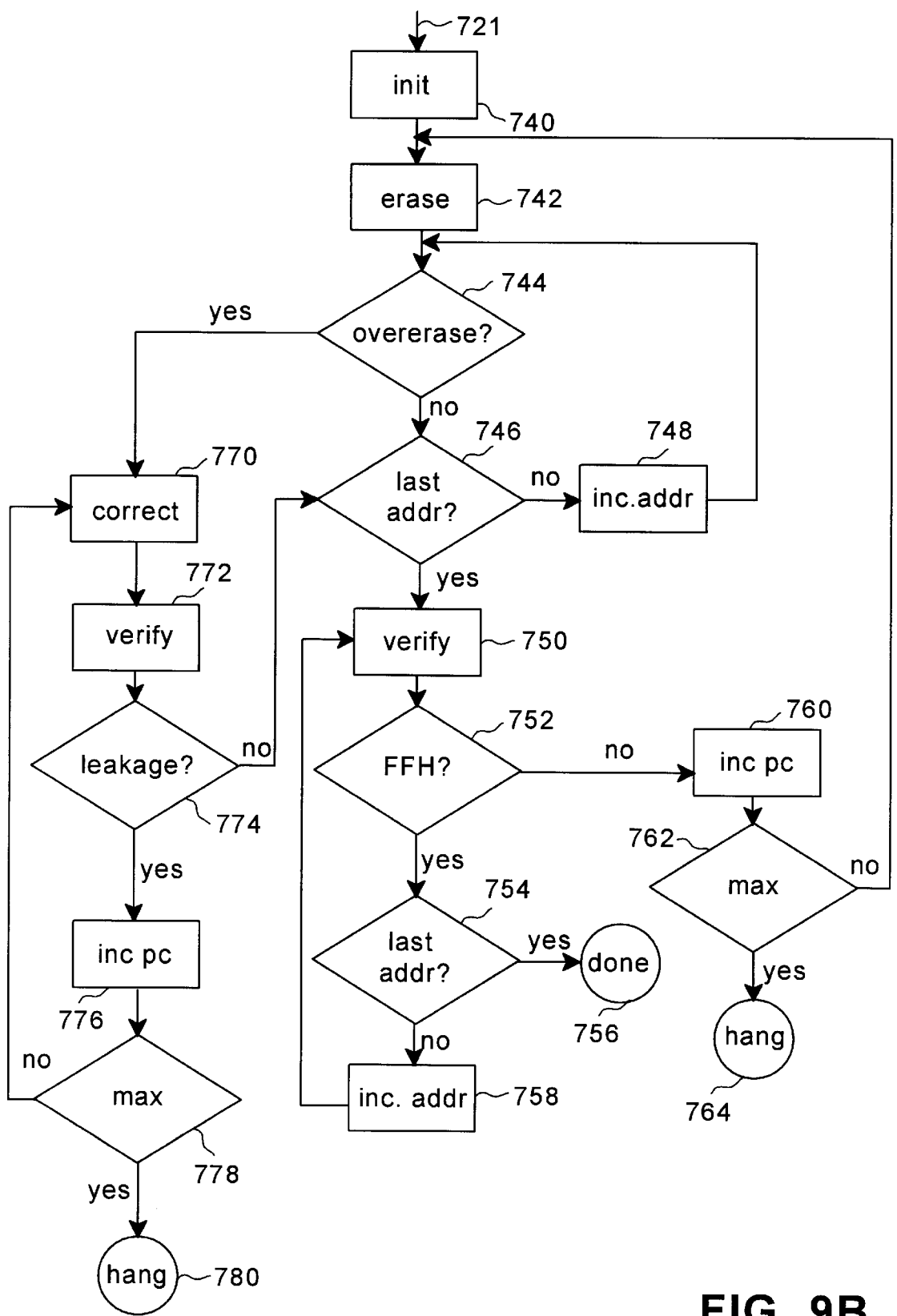

FIGS. 9A and 9B illustrate the flow of the embedded erase sequence which is controlled by state machine and control logic 104. When a user writes the embedded erase set-up command in step 604 of FIG. 8, the state machine receives that set-up command in step 712. When the user writes the embedded erase command in step 606, the state machine receives the erase command in step 714. At that point, the user then writes the address of the sector to be erased on the address input EXT_addr. In one embodiment, memory device 100 will allow a user to erase more than one sector at a time. In that case, the user will have to write more than one address.

Before memory device 100 erases any sectors, all bits in the sector must be programmed. Steps 716 through 734 are part of the process of programming all bytes prior to erase. In step 716, state machine and control logic 104 verifies whether the first byte in the addressed sector has been programmed. That is, the address of the first byte is sent, via the address sequencer internal to state machine and control logic 104, to the decoders. The addressed data is sent to verify sense amplifier 186. In step 718, state machine and control logic 104 determines whether the byte is completely programmed (e.g. the data in the byte is 00H). If the data for that byte is completely programmed then the device determines whether that byte was the last address in the sector (step 720). If so, then the sector is completely programmed and the device is ready to begin erasure. Arrow 721 connects the flow chart of FIG. 9A to the flow chart of FIG. 9B. Thus, when the last address is reached in step 720 the flow follows arrow 721 and moves on to the steps described in FIG. 9B. If the last address was not reached, the address sequencer is incremented (722) and steps 716 and 718 are repeated.

If in step 718 state machine and control logic 104 determines that the byte is not programmed, then the byte is programmed in the following steps. In step 724 the pulse counter is set. In step 726 the byte is programmed and in step 728 state machine and control logic 104 attempts to verify whether the byte has been programmed properly. If the byte has been programmed properly (step 730) then the device loops to step 720 to determine whether the byte is the last byte in the sector. If the byte was not programmed properly (step 730) then the pulse counter is incremented (step 732). If the pulse counter is at its maximum value (step 734) then memory device 100 will hang. If the pulse counter is not at its maximum value, the sequence will loop back to step 726 and there will be another attempt to program the byte. After all the bytes in the addressed sector has been programmed, the sector will be erased.

In step 740 (FIG. 9B), the address sequencer is initialized back to the first address of the sector and the pulse counter is reset. In step 742, the addressed sector is bulk erased using common methods known in the art for flash memories. In step 744, the device determines whether the first byte in the sector has been over-erased. If it has not, then in step 746 the device determines whether the byte being considered for overerasure is the last byte in the sector. If it was not the last byte in the sector, then the address sequencer 110 is incremented and the next byte is checked for overerase. If any byte is determined to be overerased, then, in step 770, corrections are made to compensate for the overerase. These corrections can be one of many standard techniques known in the art for dealing with overerased flash memory cells. Prior to step 770, the pulse counter is reset. In step 772 the system verifies whether the overerased cell has been properly fixed. If there is no leakage current (step 774), then the sequence loops back to step 746 and determines whether this is the last byte in the sector. Additionally, the pulse counter is set back to the value it had prior to step 770. If there is still more leakage current, then the pulse counter is incremented in step 776. In step 778 the system determines whether the pulse counter is at its maximum value. If it is, the system hangs (step 780). If the pulse counter is not at its maximum value, the system loops back to step 770 in order to perform the overerase correction again.

After it is determined that all the bytes had not been overerased, the system performs a byte by byte erase verify. If a particular byte is FFH then the erase for that particular byte was successful (step 750). After determining that the byte was successfully erased, the state machine determines whether the byte just considered is the last byte in the sector (step 754). If it is the last byte, then erasure is completed (step 756). If it is not the last byte, then the address sequencer is incremented (step 758) and the sequence loops back to step 750 in order to verify the next byte. If, in step 752, it is determined that the data was not FFH (e.g. erasure was not successful) then the pulse counter is incremented in step 760. If the pulse counter was incremented to its maximum value (step 762) then the system hangs (step 764). If the pulse counter was not incremented to its maximum value, then the system loops back to step 742.

The embedded erase sequence described above describes erasing a sector. Alternatives include erasing multiple sectors or an entire bank of sectors. In each alternative, the method of FIGS. 8, 9A and 9B would be appropriately altered. For example, the pre-erase verification would need to be carried out for each sector and the bulk erase would include verifying each sector.

Figure 10:
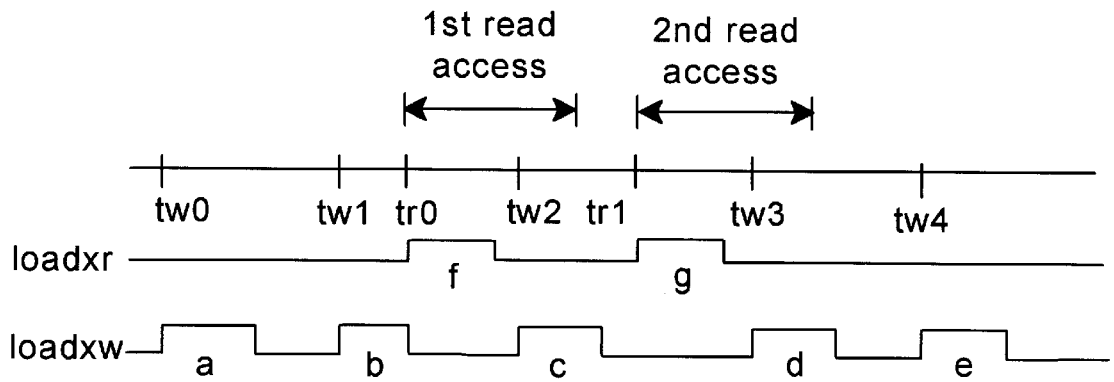
FIG. 10 is a timing diagram which explains the simultaneous read/write capability of the present invention.

FIG. 10 is a timing diagram that illustrates the advantages of the present invention. For example purposes assume that a user is performing an erase sequence for sector 1. As discussed above, the erase sequence includes preprogramming and verifying each address in the sector being erased. FIG. 10 shows times tw0, tw1, tw2, tw3, tw4, . . . which represent write accesses to memory cells. That is, tw0 indicates a first write access to a first memory cell in the sector chosen for write, tw1 represents a second access to a second memory cell in the sector chosen for the write. At time two loadxw is asserted (pulse a) for the first write and at time tw1 loadxw is asserted (pulse b) for a second attempted write. These accesses may be preprogramming accesses or verification accesses. The point is that each access involves the state machine and control logic 104 generating a write address and latching an appropriate word line.

During the write sequence, a user can request a read operation. Time tr0 represents a first read operation. At time tr0 a read address is presented at EXT_addr. After some delay (not shown in drawing) address transition detector 102 asserts loadxr (pulse f). X decode 120 and the appropriate Y decode are used to access the appropriate memory cell. The appropriate word line is latched and the remainder of the read operation is performed. As discussed above, if loadxr is asserted then loadxw cannot be asserted. When loadxr is asserted at pulse f, loadxw was already asserted. Therefore, loadxw is interrupted. This explains why pulse b has a shorter duration than pulse a. Since loadxr is only asserted for half the read access time then a write access can begin, or be restarted, at tw2, which is at least (if not more than) halfway through the first read access commenced at time tr0. At time tw2, state machine and control logic 104 presents a new address to the decoders and asserts loadxw (pulse c). The address from the state machine SM_addr is decoded and the appropriate word line is latched. Thus, by time multiplexing, two word lines are latched during a single read access time so that two memory cells can be accessed at the same time, one for reading and one for writing. Subsequent to the latching of the appropriate word line for the write access at tw2, a user can then request another read access at time tr1. Again a new address is presented at EXT_addr, loadxr is asserted (pulse g), the address is decoded and the appropriate word line is latched. This process can continue allowing simultaneous read and write operations.

Figure 11:
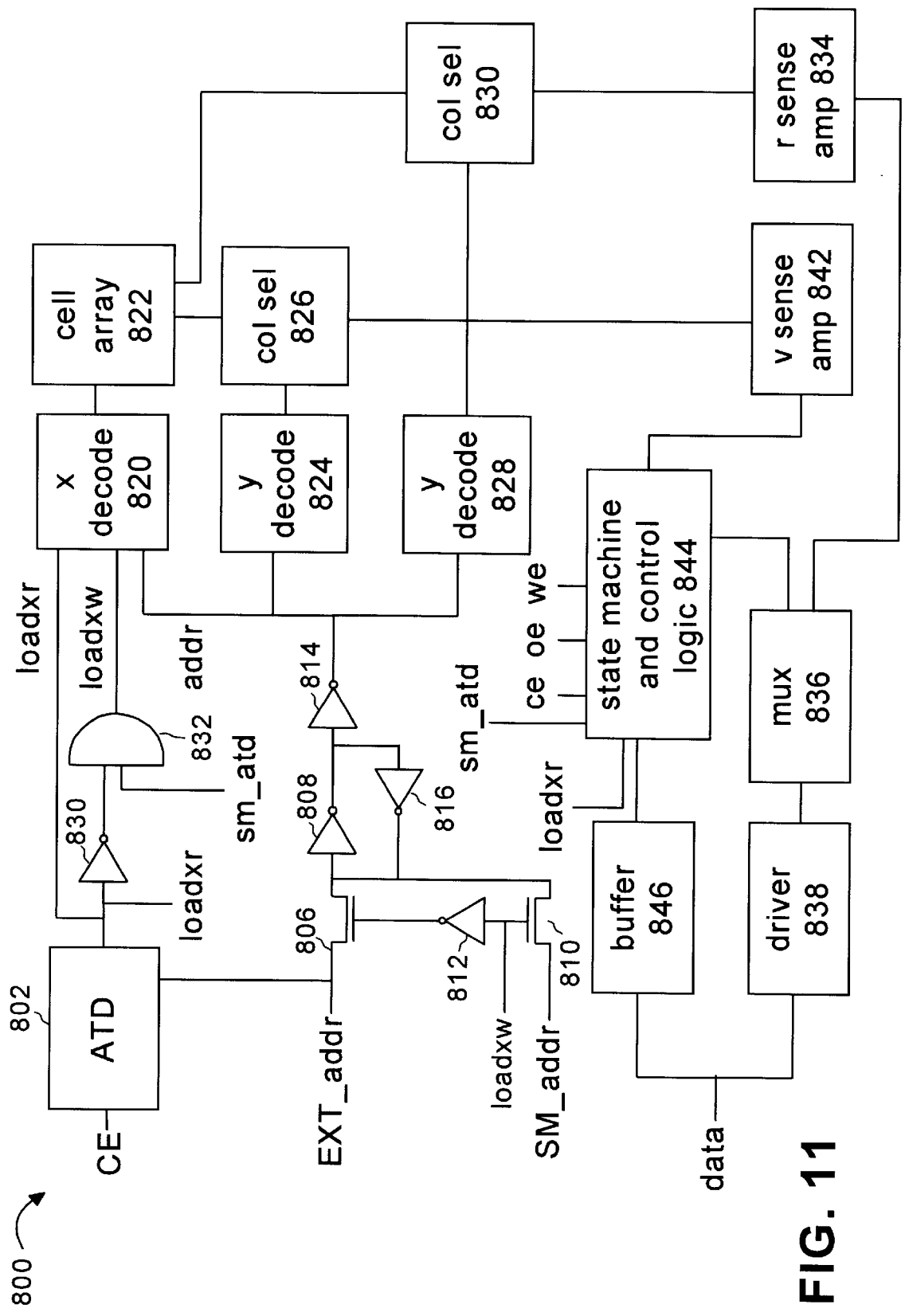
FIG. 11 is a block diagram of a second embodiment memory device according to the present invention.

FIG. 11 illustrates a second embodiment non-volatile memory device 800 that enables simultaneous read and write operations. The non-volatile memory device 800 includes a memory array, 822, cell array subdivided into sectors that include a dual-port structure. In one embodiment, memory device 800 is a flash memory and the write operations include programming operations and erase operations of flash memory cells.

Address input EXT_addr is sent to transistor 806 and address transition detector 802. Transistor 806 is connected to the input of inverter 808 and transistor 810. The gate of transistor 806 is connected to the output of inverter 812. The output of inverter 808 is connected to the input of inverters 814 and 816. The output of inverter 816 is connected to the input of inverter 808. The output of inverter 814 is connected to X decode 820, Y decode 824 and Y decode 828. Note the address EXT_addr includes multiple bits; therefore, the circuit includes a set of components for each bit and the output of inverter(s) 814 includes multiple bits which are appropriately routed to the decoders.

Address transition detector 802 receives the external address EXT_addr and asserts its output when the external address EXT_addr changes. The output of address transition detector 802 (labeled loadxr) is connected to inverter 830, X decode 820 and state machine and control logic 844. The output of inverter 830 is connected to AND gate 832. A second input to AND gate 832 is a signal sm_atd which is generated by state machine and control logic 844. State machine and control logic 844 is similar to state machine and control logic 104. The output of AND gate 832 (labeled loadxw) is communicated to X decode 820 and the gate of transistor 810. State machine and control logic 844 includes an address sequencer in order to generate addresses for write operations. When the address generated by the state machine and control logic 844 changes the signal sm_atd is asserted by state machine and control logic 844. The address SM_addr generated by the state machine and control logic 844 is sent to transistor 810. X decode 820 receives the address, loadxr and loadxw in order to decode and latch the correct word line. X decode 820 is similar to X decode 120 in FIG. 1. Y decode 824 receives the address and uses column select 826 to select and access the appropriate bit line for write operations. Y decode 828 receives an address and uses column select 830 to access the appropriate bit line for a read operation. During a write operation, data from cell array 822 is sent, via column select 826 to verify sense amplifier 842. During a read operation, data read from cell array 822 is sent, via column select 830 to read sense amplifier 834. The output of read sense amplifier 834 is sent to multiplexer 836. The output of multiplexer 836 is sent to driver 838 for output from device 800. Data from verify sense amplifier 842 is sent to state machine and control logic in order to verify the appropriate data and, possibly, send status data to a user of the memory device via driver 838. A second input to multiplexer 836 is from state machine and control logic 844. Data is sent in to state machine and control logic 844 via the data line and buffer 846.

The device of FIG. 11 is similar to the device of FIG. 1 with some exceptions. Most notably, the memory cells are not split into two banks. Rather, there is one set of memory cells divided into sectors and there are separate Y decode paths for read and write. While the write y decode path is accessing one sector the read decode path can access a different sector. Thus, a read operation can be performed in one sector while a write operation is being performed in another sector.

FIG. 11 does not show all of the voltage sources necessary for operating a non-volatile memory. These voltage sources are known in the art and adding them to FIG. 11 will only serve to clutter the drawing. In one embodiment, however, the memory device of FIG. 11 can utilize voltage sources similar to the voltage sources described with respect to FIG. 1, as are suitable.

Figure 12:
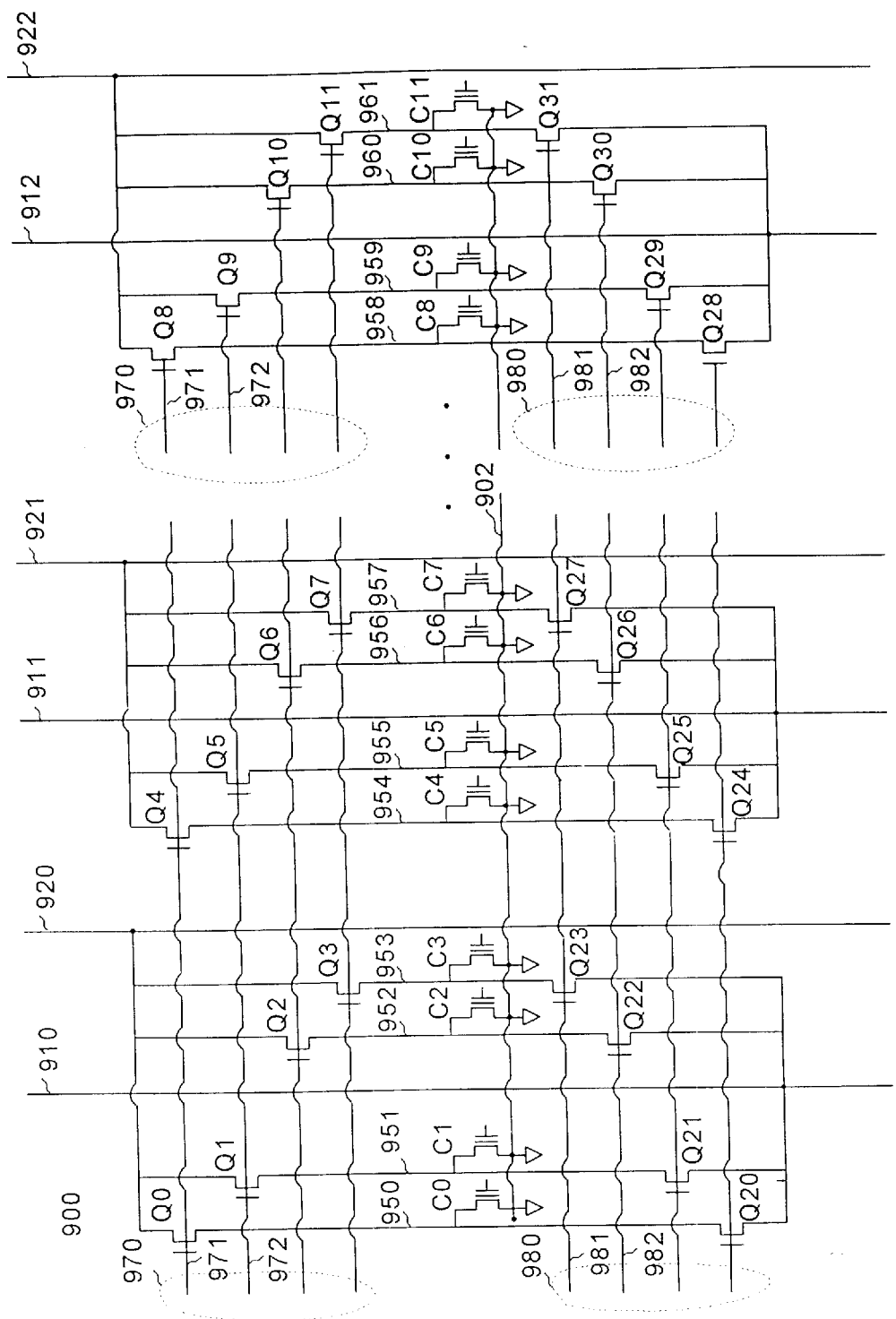
FIG. 12 illustrates one example of an array of memory cells suitable for use in the memory device depicted in FIG. 11.

FIG. 12 illustrates an exemplar sector of memory cells 900 for one embodiment of the device of FIG. 11. The architecture of the sector 900 provides a dual port structure. Sector 900 contains an array of memory cells C0–C11 which in one embodiment are implemented as flash memory cells. The memory cells C0–C11 are each coupled to a common VSS line 902 within sector 900. The selection circuitry in sector 900 includes a set of transistors Q0–Q11 and Q20–Q31 that selectively couple the write bit lines 910–912 and the read bit lines 920–22 to the memory cells C0–C11 as required by the particular read and program/erase operations. The transistors Q0–Q11 and the transistors Q20–Q31 function as pass gates that are controlled by the read sector select signals 970 and the write sector select signals 980, respectively.

The memory cells C0–C11 are individually coupled to a set of interconnect lines 950–61, respectively. Transistors Q0–Q3 selectively couple the read bit line 920 to the memory cells C0–C3 under control of the read sector select signals 970. The transistors Q4–Q7 selectively couple the read bit line 921 to the memory cells C4–C7 under control of the read sector select signals 970. Similarly, the transistors Q8–Q11 selectively couple the read bit line 922 to the memory cells C8–C11 under control of the read sector select signals 970.

For example, activating read sector select signal 971 couples memory cells C0, C4, and C8 to the read bit lines 920, 921, and 922, respectively, during read operations. Similarly, activating read sector select signal 972 couples memory cells C1, C5, and C9 to the read bit lines 920, 921, and 922, respectively, during a read operation.

Transistors Q20–Q23 selectively couple the write bit line 910 to the memory cells C0–C3 under control of the write sector select signals 980. Transistors Q24–Q27 selectively couple the write bit line 911 to the memory cells C4–C7 under control of the write sector select signals 980. Similarly, the transistors Q28–Q31 selectively couple the write bit line 912 to the flash memory cells C8–C11 under control of the write sector select signals 980.

For example, activating write sector select signal 981 couples memory cells C3, C7, and C11 to the write bit lines 910, 911, and 912, respectively, during a program or erase operation. Similarly, activating write sector select signal 982 couples memory cells C2, C6, and C10 to the write bit lines 910, 911 and 912 respectively, during a program or erase operation.

In other embodiments of the non-volatile memory device 800, only a subset of the array sectors contain the selection circuitry that enables simultaneous read and program/erase operations. Such a restriction of simultaneous read and program/erase lowers the cost and die space consumed by the read bit line and write bit line selection circuitry for systems that require only small areas of random access to the non-volatile memory device.

Note that the memory devices depicted in FIGS. 1 and 11 have only one word (or word line) decode path. That is, there is only one address line for x decode, one x decoder and one set of word lines. Having only one x decode path saves space on the memory device. The technology discussed above with respect to the x decode path can be used with many different memory architectures and y decode designs. FIGS. 1 and 11 only show two of the many different designs that can utilize the technology of the present invention. Alternative embodiments can also utilize the technology described herein for the y decode path so that the bit lines are latched. Thus, one alternative includes using latches for the bit lines and the word lines while a second alternative includes using latches for the bit lines and not using latches for the word lines.

The foregoing detailed description of the invention has been presented for purposes of illustration and description. It is not intended to be exhaustive or to limit the invention to the precise form disclosed, and obviously many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A non-volatile memory, comprising:
    a plurality of non-volatile memory cells;
    address decode logic;
    a plurality of access lines connecting said address decode logic to said memory cells; and
    a plurality of electrical latches connected to at least a subset of said access lines;
    wherein one of said latches is configured to hold a first word line at a write voltage while another of said latches is configured to hold a second word line at a read voltage.

2. A non-volatile memory according to claim 1, wherein: said memory cells are organized into at least two sectors.

3. A non-volatile memory according to claim 1, wherein: said memory cells are organized into at least two banks.

4. A non-volatile memory according to claim 1, wherein: said memory cells are flash memory cells.

5. A non-volatile memory according to claim 1, wherein:
    said latches are at least partially enabled by a read operation signal and a write operation signal such that said one of said latches holds a first word line at a read voltage while said another of said latches holds a second word line at a write voltage.

6. A non-volatile memory according to claim 1, further including:
    an address transition detector communicating a first load signal to said plurality of electrical latches causing a first selected latch of said plurality of electrical latches to hold a first selected word line at a first voltage during a first time period.

7. A non-volatile memory according to claim 6, further including:
    a control circuit in communication with said address transition detector and said address decode logic, said control circuit generating a first address and a second load signal, said second load signal being communicated to said plurality of electrical latches causing a second selected latch of said plurality of electrical latches to hold a second selected word line at a second voltage during a second time period, said first time period capable of at least partially overlapping with said second time period.

8. A non-volatile memory according to claim 7, further including:
    a selection circuit receiving said first address and a second address, said second address originating from a source external to said non-volatile memory, said selection circuit selectively communicates either said first address or said second address to said address decode logic.

9. A non-volatile memory according to claim 1, wherein:
    said address decode logic includes word line decode logic;
    said access lines include word lines connecting said word line decode logic to said memory cells; and
    said electrical latches are connected to said word lines.

10. A non-volatile memory according to claim 9, further including:
    an address transition detector communicating a first load signal to said electrical latches.

11. A non-volatile memory according to claim 1, wherein:
    said address decode logic includes word line decode logic and bit line decode logic;
    said access lines includes word lines connecting said word line decode logic to said memory cells and bit lines connecting said bit line decode logic to said memory cells; and
    said electrical latches are connected to said word lines.

12. A non-volatile memory according to claim 1, wherein:
    said address decode logic includes word line decode logic and bit line decode logic;
    said access lines include word lines connecting said word line decode logic to said memory cells and bit lines connecting said bit line decode logic to said memory cells; and
    said electrical latches are connected to said word lines and said bit lines.

13. A non-volatile memory according to claim 1, wherein:
    said memory cells are flash memory cells;
    said flash memory cells are organized into at least a first bank of memory cells and a second bank of memory cells;
    said address decode logic includes word line decode logic, first bit line decode logic and second bit line decode logic;
    said access lines include word lines connecting said word line decode logic to said first bank of memory cells and said second bank of memory cells, a first set of bit lines connecting said first bit line decode logic to said first bank of memory cells and a second set of bit lines connecting said second bit line decode logic to said second bank of memory cells; and
    said electrical latches are connected to said word lines.

14. A non-volatile memory according to claim 13, further including:
    an address transition detector communicating a first load signal to said plurality of electrical latches causing a first selected latch of said plurality of electrical latches to hold a first selected word line at a first voltage during a first time period;

a control circuit in communication with said address transition detector and said address decode logic, said control circuit generating a first address and a second load signal, said second load signal being communicated to said plurality of electrical latches causing a second selected latch of said plurality of electrical latches to hold a second selected word line at a second voltage during a second time period, said first time period and said second time period capable of at least partially overlapping; and a selection circuit receiving said first address and a second address, said second address originating from a source external to said non-volatile memory, said selection circuit selectively communicates either said first address or said second address to said address decode logic.

15. A non-volatile memory according to claim 14, further including:

a sense amplifier in communication with said memory cells.

16. A non-volatile memory according to claim 14, further including:

a first sense amplifier in communication with said first bank of memory cells; and a second sense amplifier in communication with said second bank of memory cells.

17. A non-volatile memory according to claim 4, wherein:

said flash memory cells are organized into at least two sets of memory cells;

said address decode logic includes word line decode logic, first bit line decode logic and second bit line decode logic;

said access lines includes word lines connecting said word line decode logic to said memory cells, a first set of bit lines connecting said first bit line decode logic to said memory cells and a second set of bit lines connecting said second bit line decode logic to said memory cells; and said electrical latches are connected to said word lines.

18. A non-volatile memory according to claim 17, further including:

at least one sense amplifier in communication with said memory cells.

19. A non-volatile memory according to claim 17, further including:

an address transition detector communicating a first load signal to said plurality of electrical latches causing a first selected latch of said plurality of electrical latches to hold a first selected word line at a first voltage during a first time period;

a control circuit in communication with said address transition detector and said address decode logic, said control circuit generating a first address and a second load signal, said second load signal being communicated to said plurality of electrical latches causing a second selected latch of said plurality of electrical latches to hold a second selected word line at a second voltage during a second time period, said first time period and said second time period capable of at least partially overlapping; and a selection circuit receiving said first address and a second address, said second address originating from a source external to said non-volatile memory, said selection circuit selectively communicates either said first address or said second address to said address decode logic.

20. A flash memory device, comprising:

a plurality of flash memory cells;

only one word decode path including word decode logic, word lines, and electrical latches, said word lines connected to said word decode logic and said flash memory cells, said electrical latches connected to said word lines such that more than one word line can be driven at different voltage levels during a single time period; and at least a first bit decode path including bit decode logic and bit lines connected to said bit decode logic and said flash memory cells.

21. A flash memory device according to claim 20, further including:

an address transition detector communicating a first load signal to said electrical latches causing a first selected latch to hold a first selected word line at a first voltage during a first time period;

a control circuit in communication with said address transition detector and said address decode logic, said control circuit generating a first address and a second load signal, said second load signal being communicated to said electrical latches causing a second selected latch to hold a second selected word line at a second voltage during a second time period, said first time period and said second time period capable of at least partially overlapping; and a selection circuit receiving said first address and a second address, said second address originating from a source external to said flash memory device, said selection circuit selectively communicates either said first address or said second address to said address decode logic.

22. A flash memory device, comprising:

a plurality of flash memory cells;

an address transition detector;

word line decode logic in communication with said address transition detector;

word lines for connecting said word line decode logic to said flash memory cells;

bit line decode logic in communication with said flash memory cells; and an electrical latch connected to at least one of said word lines and said word line decode logic;

wherein said electrical latch is configured to allow at least one of said word lines to be held at a read voltage and another of said word lines to be held at a write voltage.

23. A non-volatile memory according to claim 22, wherein:

said address transition detector generates a first load signal which is capable of actuating said latch.

24. A non-volatile memory according to claim 23, further including:

a control circuit in communication with said address transition detector and said address decode logic, said control circuit generating a first address and a second load signal, said second load signal capable of actuating said latch; and a selection circuit receiving said first address and a second address, said second address originating from a source external to said flash memory device, said selection circuit selectively communicates either said first address or said second address to said word line decode logic.

25. A non-volatile memory, comprising:

a plurality of flash memory cells;

means for decoding an address to a plurality of word lines connected to said memory cells;

first holding means for holding a first word line of said plurality of word lines at a write voltage, said first word line for accessing a first memory cell; and second holding means for holding a second word line of said plurality of word lines at a read voltage, said second word line for accessing a second memory cell, said second means capable of holding said second word line while said first means holds said first word line.

26. A non-volatile memory according to claim 25, further including:

means for performing a write process to said first memory cell; and means for reading from said second memory cell capable of reading from said second memory cell after said write process has begun and before said write process has completed.

27. A non-volatile memory according to claim 25, wherein:

said first holding means and said second holding means include an electrical latch.

28. A method of accessing a non-volatile memory, comprising the steps of:

a) decoding a first address;

b) supplying a first access signal;

c) holding said first access signal at a write voltage;

d) writing a first memory cell using said first access signal, said first memory cell corresponding to said first address;

e) decoding a second address;

f) supplying a second access signal;

g) holding said second access signal at a read voltage; and h) reading a second memory cell using said second access signal, said second memory cell corresponding to said second address wherein said step g) holding and step e) holding are at least partially performed during a same time period.

29. A method according to claim 28, wherein:

said first access signal is supplied on a first word line; and said step c) holding latches said first access signal on said first word line.

30. A method according to claim 28, wherein:

said step a) decoding includes receiving said first address and selecting a first word line.

31. A method according to claim 28, wherein:

said step b) supplying includes driving a first word line.

32. A method according to claim 28, wherein:

said step d) writing includes erasing data from said first memory cell.

33. A method according to claim 28, wherein:

said step d) writing includes programming said first memory cell.

34. A method of reading and writing in a non-volatile memory, comprising the steps of:

commencing a write process;

decoding a write address and driving a first access line corresponding to said write address;

holding said first access line;

writing to a first memory cell corresponding to said write address;

completing said write process;

decoding a read address and driving a second access line corresponding to said read address, said second access line being different from said first access line;

holding said second access line; and reading from a second memory cell corresponding to said read address, said step of reading being performed after said step of commencing and prior to said step of completing said write process.

35. A method according to claim 34, wherein:

said first and second memory cells are flash memory cells.

36. A method according to claim 34, wherein:

said write process includes erasing multiple flash memory cells.

37. A method according to claim 34, wherein:

said step of holding said first access line being performed during a first time period; and said step of holding said second access line being performed during a second time period, said first time period capable of at least partially overlapping with said second time period.

38. A method according to claim 34, further including the step of:

detecting a first address transition;

generating a first signal indicating said first address transition;

communicating said first signal to a first latch, said first latch performing said step of holding said first access line;

detecting a second address transition;

generating a second signal indicating said second address transition; and communicating said second signal to a second latch, said second latch performing said step of holding said second access line.

39. A method according to claim 38, wherein:

said step of communicating said first signal is performed at a different time than said step of communicating said second signal.

40. A flash memory, comprising:

a plurality of flash memory cells; and means for writing to a first set of said flash memory cells while reading a second set of said flash memory cells;

wherein said means for writing includes means for holding, at least partially during a same time period, a first word line at a write voltage and a second word line at a read voltage.

* * * * *